United States Patent
Kang et al.

(10) Patent No.: US 6,784,084 B2
(45) Date of Patent: Aug. 31, 2004

(54) METHOD FOR FABRICATING SEMICONDUCTOR DEVICE CAPABLE OF REDUCING SEAM GENERATIONS

(75) Inventors: Hyeok Kang, Seoul (KR); Sung-Kwon Lee, Ichon-shi (KR); Min-Suk Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 16 days.

(21) Appl. No.: 10/607,052

(22) Filed: Jun. 27, 2003

(65) Prior Publication Data

US 2004/0082162 A1 Apr. 29, 2004

(30) Foreign Application Priority Data

Jun. 29, 2002 (KR) ................................. 10-2002-0037257
Nov. 20, 2002 (KR) ................................. 10-2002-0072240
Dec. 26, 2002 (KR) ................................. 10-2002-0084097

(51) Int. Cl.[7] .................. H01L 21/3205; H01L 21/4763
(52) U.S. Cl. ....................... 438/586; 438/597; 438/618; 438/666; 438/672; 438/740; 438/745; 438/902; 438/906; 438/976
(58) Field of Search ................................. 438/233, 533, 438/586, 597, 618, 621, 666, 672, 700, 740, 745, 902, 906, 976

(56) References Cited

U.S. PATENT DOCUMENTS 6,232,224 B1 * 5/2001 Inoue .......................... 438/639
6,258,678 B1 * 7/2001 Liaw ........................... 438/303
2002/0090837 A1 * 7/2002 Chung et al. ................ 438/980

* cited by examiner

*Primary Examiner*—Lynne Gurley
(74) *Attorney, Agent, or Firm*—Jacobson Holman PLLC

(57) ABSTRACT

The present invention is related to a method for fabricating a semiconductor device capable of preventing occurrences of void and seam phenomena caused by a negative slope of an insulation layer or a bowing profile phenomenon in a cross-sectioned etch profile of a contact hole. To achieve this effect, the attack barrier layer or the capping layer is additionally deposited on the profile containing self-aligned contact holes in order to prevent an undercut of the inter-layer insulation layer, which is a main cause of the seam generations. Also, the attack barrier layer has a function of preventing the inter-layer insulation layer from being attacked during the wet cleaning/etching process. Ultimately, it is possible to improve device characteristics with the prevention of the seam generations.

18 Claims, 11 Drawing Sheets

METHOD FOR FABRICATING SEMICONDUCTOR DEVICE CAPABLE OF REDUCING SEAM GENERATIONS

FIELD OF THE INVENTION

The present invention relates to a method for fabricating a semiconductor device; and, more particularly, to a method for fabricating a semiconductor device capable of reducing generations of seam when a self-aligned contact (SAC) plug is formed.

DESCRIPTION OF RELATED ART

It is difficult to obtain process margins of a pattern formation process and overlay accuracy through a mere improvement on a level of integration in a semiconductor device. To solve these problems, a self-aligned contact (SAC) process is employed because it is cost-effective owing to a fact that an additional mask is not required for forming a contact hole pattern and the like. Among various schemes of carrying out the SAC process, the most typical scheme is to use a nitride layer as an etch barrier layer.

Also, because of the high level of integration, a contact process for forming an inter-layer contact, e.g., a plug, is employed. For instance, in about 0.15 µm semiconductor devices, a hole-type contact mask is used in forming a bit line contact or a storage node contact. However, this use of the hole-type contact mask is not sufficient to secure a contact region due to a misalignment occurring during a photo-etching process. Therefore, a method of using different etch selectivity values between two different types of inter-layer insulation layers, e.g., an oxide layer and a nitride layer, is employed to secure the contact region. This method is employed in the aforementioned SAC process.

More specifically to the SAC process for forming a plug, an oxide layer for insulating a space between plugs is first etched to form a plug contact hole. Then, such material as polysilicon is deposited into the contact hole, and a chemical mechanical polishing (CMP) process is performed thereto to fill the polysilicon into the contact hole so that a plug is formed. Also, a T-type plug mask or an I-type plug mask is used in the SAC process for forming the plug.

However, in spite of the advantages of the SAC process, seams are more likely generated when the polysilicon is used as a plug material. The reason for this problem is because of a deterioration of topology caused by an undercut of an insulation layer. For example, the seam usually occurs at a storage node contact plug and a bit line contact plug when they are made of polysilicon.

Also, a chance of the seam generation is much higher at a portion of the insulation layer having a negative slope produced by the undercut of the insulation layer. Particularly, the seam is a main cause for degrading device characteristics. An increase of leakage currents is one example.

FIGS. 1A to 1E are cross-sectional views showing a conventional method for forming a SAC plug with use of the SAC process.

Referring to FIG. 1A, a plurality of device isolation layers 102 defining active regions 101 are formed in a substrate 100. A local oxidation of silicon (LOCOS) technique or a shallow trench isolation (STI) technique is employed for forming the device isolation layers 102. Also, each of the active regions 101 has an elongated elliptical shape when viewed from a top of the substrate 100. It should be also noted that there are a plurality of the active regions 101 defined by the device isolation layers 102 although they are expressed in a more simple representation for convenience.

A conductive layer 104A for forming a gate electrode (hereinafter referred to as a gate conductive layer) and a hard mask 104B for forming the gate electrode (hereinafter referred to as a gate hard mask) are sequentially formed on an entire surface of the substrate structure. Although it is not illustrated, an oxide-based insulation layer for forming the gate electrode (hereinafter referred to as a gate insulation layer) is formed beneath the gate conductive layer 104A. The gate insulation layer has a thickness in a range from about 50 Å to about 100 Å. Herein, the gate conductive layer 104A is a single layer or a stacked layer of such materials as polysilicon, tungsten, tungsten nitride or/and tungsten silicide.

The gate hard mask 104B is made of such material like silicon nitride having a different etch selectivity from a subsequent inter-layer insulation layer 108 shown in FIG. 1B. Also, the gate hard mask 104B has a thickness ranging from about 1000 Å to about 2000 Å.

For a lightly doped drain (LDD) structure, a low concentration of impurity ions for a source/drain is implanted into the active regions 101 formed at both sides of the gate electrode 104. Then, an etch stop layer 106 for forming a spacer for the gate electrode (hereinafter referred to as gate spacer) is deposited on the above entire substrate structure including the gate hard mask 104B and the gate conductive layer 104A. As like the gate hard mask 104B, the etch stop layer 106 is made of nitride having a different etch selectivity from the inter-layer insulation layer 108 shown in FIG. 1B. At this time, the etch stop layer 106 is deposited to a thickness in a range from about 300 Å to about 1000 Å. However, it is much preferable to deposit the etch stop layer 106 to a thickness of about 500 Å.

A photoresist pattern (not shown) is formed to make a core cell and a peripheral circuit regions opened. A blanket-etch process is then preformed to the etch stop layer 106 by using the photoresist pattern as an etch mask so that the gate spacer is formed at lateral sides of the gate electrode in the core cell and the peripheral circuit regions.

Next, a high concentration of impurity ions is implanted into the active regions 101 formed at both sides of the gate spacer to thereby form transistors in the core cell and the peripheral circuit regions. At this time, the etch stop layer 106 in the core cell array region is not etched to be used as another etch stop layer for the inter-layer insulation layer 108.

As shown in FIG. 1B, the inter-layer insulation layer 108 is formed on the above substrate structure including the etch stop layer 106. Herein, the inter-layer insulation layer 108 is made of an oxide layer having an excellent gap-fill property for preventing occurrences of a void phenomenon. Also, the inter-layer insulation layer 108 has a thickness ranging from about 3000 Å to about 9000 Å. A preferable deposition thickness of the inter-layer insulation layer 108 is about 5000 Å. Afterwards, a chemical mechanical polishing (CMP) process or a blanket-etch process is performed to planarize the inter-layer insulation layer 108. The planarized inter-layer insulation layer 108 remains on the gate hard mask 104B with a thickness T of about 1000 Å.

A photoresist pattern 110 is formed on the inter-layer insulation layer 108 in such a manner that a region 111 for forming a SAC (hereinafter referred to as a SAC region) in the core cell array region is opened. The SAC region 111 can be a storage node contact region, a bit line contact region or a merged contact region obtained by merging the storage node contact region and the bit line contact region together. Herein, the illustrated SAC region is the merged contact region. The merged contact region is formed in a T-shape and includes a partial portion of the active region 101 and that of a non-active region.

In case of the T-shaped merged contact region, the size of the merged contact region is bigger than that of each storage node contact region and bit line contact region itself. As a result of this increased size, it is possible to prevent an etch-stop phenomenon usually occurring when the contact region is small. In addition, compared to a structure taught in an article by Kohyama et al. entitled "A fully printable, self-aligned and planarized stacked capacitor DRAM cell technology for 1 Gbit DRAM and beyond", *symp. On VLSI. Digest of Technical Papers*, PP. 17–18, (1997), an occupying area of the photoresist pattern increases to thereby improve etch selectivity.

Next, the inter-layer insulation layer 108 and the etch stop layer 106 are sequentially etched until a partial portion of the active region 101 is exposed. From this etching, a plurality of contact holes 111A are formed. During the etching to the inter-layer insulation layer 108, the etch stop layer 106 serves, to play an etch-stop function.

Meanwhile, referring to FIG. 1C, the etching to the etch stop layer 106 results in a formation of a gate spacer 106A at lateral sides of the gate hard mask 104B in the core cell array region. Impurity ions are then implanted into the active regions 101 formed at both sides of the gate spacer 106A in order to reduce a contact resistance between a SAC plug and the active region 101 formed beneath the SAC plug.

As shown, after the photoresist pattern is removed 110, a conductive layer, for instance, a polysilicon layer 112 is deposited until completely being filled into the contact holes 111A. At this time, the deposition thickness ranges from about 3000 Å to about 7000 Å. Afterwards, the polysilicon layer 112 is planarized by performing a CMP process or a blanket etch process until an upper surface of the inter-layer insulation layer 108 is exposed. In case of performing the CMP process to the polysilicon layer 112, slurry used for etching a typical polysilicon is employed.

Subsequently, a CMP process is performed again to the inter-layer insulation layer 108 and the polysilicon layer 112 until an upper portion of the etch stop layer 106 is exposed. This CMP process defines storage node contact plugs 112A and bit line contact plugs 112B electrically isolated from each other. The CMP process subjected to the inter-layer insulation layer 108 and the polysilicon layer 112 also employs slurry used for etching a typical oxide layer.

In case that the SAC contact region 111 as shown in FIG. 1B is not the merged contact region, the above CMP process for isolating electrically the storage node contact plugs 112A and the bit line contact plugs 112B can be omitted.

The seam is generated more frequently as an area of an opening portion of each contact hole 111A decreases. Particularly, the seam generation is more severe when an upper part of the gate electrode 104 gets to have a slope by etching the etch stop layer 106.

In addition to the above-described approach, another approach can be employed to secure sufficiently the contact region. First, an etching is stopped right above the etch stop layer, and a photoresist strip process and a wet cleaning/etching process are performed thereafter. Then, in the step of removing the etch stop layer, a capping layer is deposited on the etch stop layer to secure a required thickness of the gate hard mask. Herein, the capping layer is made of such material having a poor coverage property as plasma enhanced chemical vapor deposition (PECVD) oxide or undoped silicate glass (USG). After the deposition of the capping layer, the oxide layer gets to remain only on the gate hard mask through the use of a wet cleaning/etching process, and the nitride layer is then removed through the use of a dry etching process.

However, this approach results in an undercut of the inter-layer insulation layer during the wet cleaning/etching process. This undercut further induces the seam generations when the SAC plug is subsequently formed. Also, the seams are more severely generated as an executing period of the wet cleaning/etching process for extending the contact hole region is longer.

FIG. 2 is a top-view of the typical semiconductor device completed with the SAC process for forming the plug. As shown, a plurality of device isolation layers 200 are allocated on a substrate structure 200. A plurality of gate electrodes are arrayed in a direction of crossing the device isolation layers 201. Herein, the reference numeral 203 is a region opened for forming a plug, i.e., a contact hole.

FIGS. 3A and 3B are cross-sectional views of FIG. 4 in each direction of the lines A–A' and B–B'.

Referring to FIG. 3A, a plurality of device isolation layers 201 are formed in a substrate 200, and then, an oxide-based gate insulation layer 202A, a gate conductive layer 202B and a gate hard mask 202C are sequentially deposited on the substrate structure. Afterwards, a photo-etching process is performed with use of the gate hard mask 202C to form a gate electrode 202. Herein, the gate conductive layer 202B is a single layer or a stacked layer of tungsten, polysilicon or tungsten silicide. Also, the gate hard mask 202C is a nitride-based layer such as a silicon nitride layer or a silicon oxynitride layer.

Next, an etch stop layer 202D made of silicon nitride or silicon oxynitride is formed at lateral sides of the gate electrode 202. An inter-layer insulation layer 204 is then formed in such a manner to be filled into a space between the gate electrodes 202. At this time, the inter-layer insulation layer 204 is preferably formed to a thickness ranging form about 2000 Å to about 10000 Å by using a material having a good planarization property such as high temperature oxide (HTO), advanced planarization layer (APL) oxide, spin on dielectric (SOD), spin on glass (SOG), tetra-ethyl-ortho silicate (TEOS), boro-phospho-silicate glass (BPS G), phospho-silicate glass (PSG) or boro-silicate glass (BSG). Also, it is preferable to perform a deposition or a deposition/planarization process so that a thickness of the inter-layer insulation layer 204 on an upper surface of the gate hard mask 202D ranges from about 0 Å to about 1000 Å.

Next, a plurality of contact holes 203 for bit line contacts or storage node contacts are formed. More specifically, a photoresist pattern (not shown) for forming the contact holes 203 is formed, and an upper part of an impurity diffusion region (not shown) allocated between the gate electrodes 202 is opened through the use of the typical SAC process.

In more detail of the SAC process, it is possible to use different types of etch gas to attain different effects. When the inter-layer insulation layer 204 made of BPSG and the like is etched, an etch gas containing carbons and inducing lots of polymers is used to provide a high etch selectivity with respect to the nitride-based layers, i.e., the gate hard mask 202C and the etch stop layer 202D. Examples of this etch gas are $C_3F_8$, $C_4F_8$, $C_5F_8$, $C_4F_6$ and $C_2F_4$. Also, such gas as $CHF_3$, $C_2HF_5$, $CH_2F_2$, $CH_3F$, $CH_2$, $CH_4$, $C_2H_4$ and $H_2$ can be also used to provide a reliable etch process by increasing an etch process margin along with the high etch selectivity. Also, such inert gas as He, Ne, Ar, Kr or Xe can be also used as the etch gas to improve an etch stop function by enhancing a sputtering effect and plasma stability. It is also possible to use a gas obtained by mixing the above etch gases with each other. It is further possible to add $C_xH_yF_z$, where x, y and z is equal to or greater than 2, to the etch gas containing lots of carbons to secure margins of the etch process.

As shown in FIG. 3B, another insulation layer is deposited on the inter-layer insulation layer 204 and the gate electrode 202 to form a capping layer 205 with an over-hang structure. Herein, the capping layer 205 is made of USG having a less powerful coverage property, and its function is to prevent losses of the gate hard mask 202C during a removal of the etch stop layer 202D for exposing a surface of the substrate 206.

However, the capping layer 205 causes degradation of a gap-fill property, and this degradation further induces generations of void and seam in case that a conductive layer for forming a plug (hereinafter referred to as plug conductive layer) is deposited after the contact holes 203 are extended through a subsequent wet cleaning/etching process and the surface of the substrate 200 is then exposed through a blanket-etch process.

Also, the generations of void and seam are caused by a bowing profile phenomenon, wherein a profile obtained prior to depositing a plug material is bent. Particularly, the capping layer 205, the etch stop layer 202D and the wet cleaning/etching process used for extending the contact holes 203 are adopted to meet trends of a decrease in pattern size and an increase in a difference in height. However, these implementations of the capping layer 205, the etch stop layer 202D and the wet cleaning/etching process become a factor for causing the bowing profile phenomenon.

The USG typically used for the capping layer 205 has a slower wet etch rate than that of BPSG typically used for the insulation layer. This usage of the USG material results in the bowing phenomenon. Particularly, the bowing phenomenon becomes more severe as an executing period of the wet cleaning/etching process for extending an opening portion of the contact hole is longer. Additionally, instead of the USG, plasma enhanced tetra-ethyl-ortho silicate (PETEOS) having a poor coverage property can be also adopted in the capping layer 205 with the over-hang structure.

As described above, the generation of the void and seam is resulted from a negative slope of the insulation layer produced by the undercut of the insulation layer. After the step of isolating the plugs, this undercut of the insulation layer further pronounces the seam generations at the plug. The seam generated at the plug becomes a main factor for degrading device characteristics. For instance, leakage currents are increased.

SUMMARY OF THE INVENTION

It is, therefore, an object of the present invention to provide a method for fabricating a semiconductor device capable of effectively preventing generations of void and seam at a plug due to a negative slope of an insulation layer and a bowing phenomenon in an etch profile of a contact hole.

In accordance with an aspect of the present invention, there is provided a method for fabricating a semiconductor device, including the steps of: forming a plurality of conductive patterns on a substrate; forming an etch stop layer along the plurality of the conductive patterns; forming an insulation layer on an entire surface of the substrate structure; etching selectively the insulation layer to form a plurality of contact holes exposing a portion of the etch stop. layer allocated in between the conductive patterns; forming an attack barrier layer for preventing the insulation layer from being attacked by a chemical used in a wet cleaning/etching process along a profile containing the contact hole; forming a capping layer having an over-hang structure on an upper part of each conductive pattern; extending an opening portion of each contact hole by performing a wet cleaning/etching process to a bottom side of each contact hole; removing selectively a portion of the etch stop layer and the attack barrier layer disposed at the bottom side of each contact hole to expose a surface of the substrate; and forming a plug contacted to the exposed surface of the contact hole.

In accordance with another aspect of the present invention, there is also provided a method for fabricating a semiconductor device, including the steps of: forming a plurality of conductive patterns on a substrate; forming an etch stop layer along the plurality of the conductive patterns; forming an insulation layer on an entire surface of the substrate structure; etching selectively the insulation layer to form a plurality of contact holes exposing a portion of the etch stop layer allocated in between the conductive patterns; forming a capping layer having an over-hang structure on an upper part of each conductive pattern; weakening bonding forces between atoms contained in sidewalls of the capping layer with use of an inert gas; extending an opening portion of the contact hole by performing a wet cleaning/etching process and simultaneously removing the sidewalls of the capping layer; removing selectively a portion of the etch stop layer disposed at a bottom side of each contact hole to expose a surface of the substrate; and forming a plug contacted to the exposed surface of the substrate.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, with reference to the accompanying drawings, there is provided descriptions on a method for forming a self-aligned contact (SAC) plug in a semiconductor device capable of preventing occurrences of void and seam and a bowing phenomenon.

Figure 4:
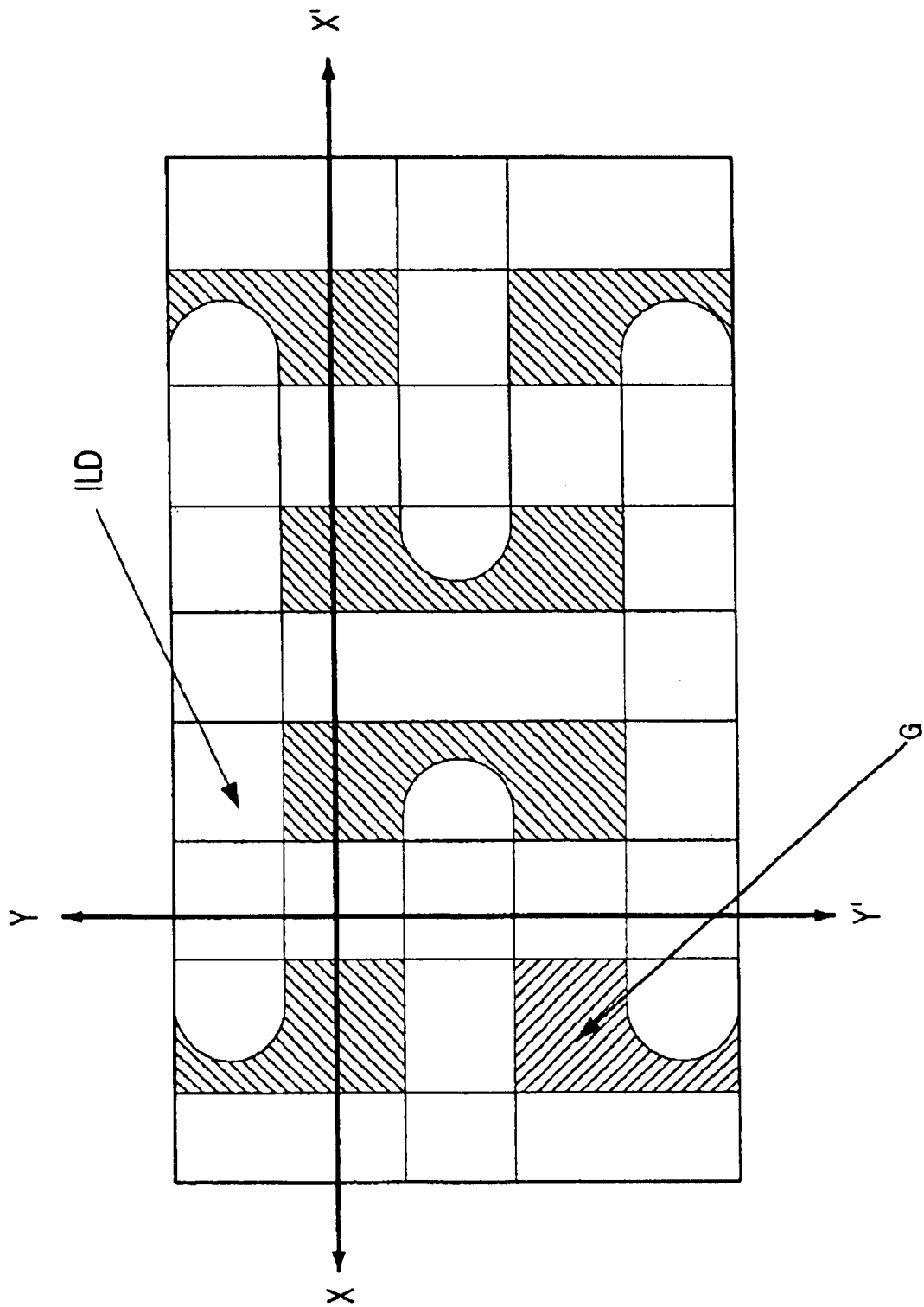
FIG. 4 is a top view showing schematically a semiconductor device including a gate electrode pattern and an insulation layer pattern.

FIG. 4 is a top view showing schematically a semiconductor device including a gate electrode pattern and an insulation layer pattern.

As shown, a plurality of gate electrode patterns G are arrayed in one direction, and a plurality of inter-layer insulation patterns ILD are arrayed in a direction of crossing the plurality of the gate electrode patterns G.

There is provided detailed descriptions on a method for forming a SAC plug with reference to FIGS. 5A to 5F showing cross-sectional views of FIG. 4 in each direction of the line X–X' and Y–Y'.

Figure 5A:
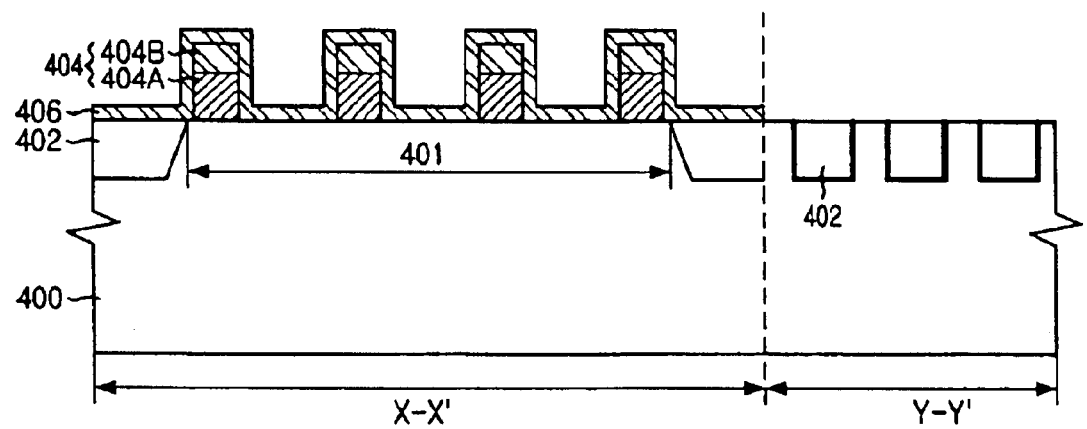
FIGS. 5A to 5F are cross-sectional views showing a method for forming a SAC plug in a semiconductor device in accordance with a first preferred embodiment of the present invention.

Referring to FIG. 5A, a plurality of device isolation layers 402 defining active regions 401 are formed on a substrate 400. A local oxidation of silicon (LOCOS) technique or a shallow trench isolation (STI) technique is employed for forming the device isolation layers 402. Also, each of the active regions 401 has an elongated elliptical shape when viewed from a top of the substrate 400. It should be also noted that there are a plurality of the active regions 401 defined by the device isolation layers 402 although they are expressed in a simple representation for convenience.

A conductive layer 404A for forming a gate electrode (hereinafter referred to as a gate conductive layer) and a hard mask 404B for forming the gate electrode (hereinafter referred to as a gate hard mask) are sequentially formed on an entire surface of the substrate structure. Although it is not illustrated, an oxide-based insulation layer for forming the gate electrode (hereinafter referred to as a gate insulation layer) is formed beneath the gate conductive layer 404A. The gate insulation layer has a thickness in a range from about 50 Å to about 100 Å. Herein, the gate conductive layer 404A is a single layer or a stacked layer of such materials as polysilicon, tungsten, tungsten nitride or tungsten silicide.

The gate hard mask 404B is made of such material like silicon nitride having a different etch selectivity from a subsequent inter-layer insulation layer 408. Also, the gate hard mask 404B has a thickness ranging from about 1000 Å to about 2000 Å.

For a lightly doped drain (LDD) structure, a low concentration of impurity ions for a source/drain is implanted into the active regions 401 formed at both sides of the gate electrode 404. Then, an etch stop layer 406 for forming a spacer for the gate electrode (hereinafter referred to as a gate spacer) is deposited on the above entire substrate structure including the gate hard mask 404B and the gate conductive layer 404A. As like the gate hard mask 404B, the etch stop layer 406 is made of nitride having a different etch selectivity from the inter-layer insulation layer 408. At this time, the etch stop layer 406 is deposited to a thickness in a range from about 300 Å to about 1000 Å. However, it is more preferable to deposit the etch stop layer 106 to a thickness of about 500 Å.

A photoresist pattern (not shown) is formed to make a core cell and a peripheral circuit regions opened. A blanket-etch process is then subjected to the etch stop layer 406 by using the photoresist pattern as an etch mask so that the gate spacer is formed at lateral sides of the gate electrode in the core cell and the peripheral circuit regions.

Next, a high concentration of impurity ions is implanted into the active regions 401 at both sides of the gate spacer to thereby form transistors in the core cell and the peripheral circuit regions. At this time, the etch stop layer 406 in the core cell array region is not etched to be used as another etch stop layer for the inter-layer insulation layer 408.

Figure 5B:
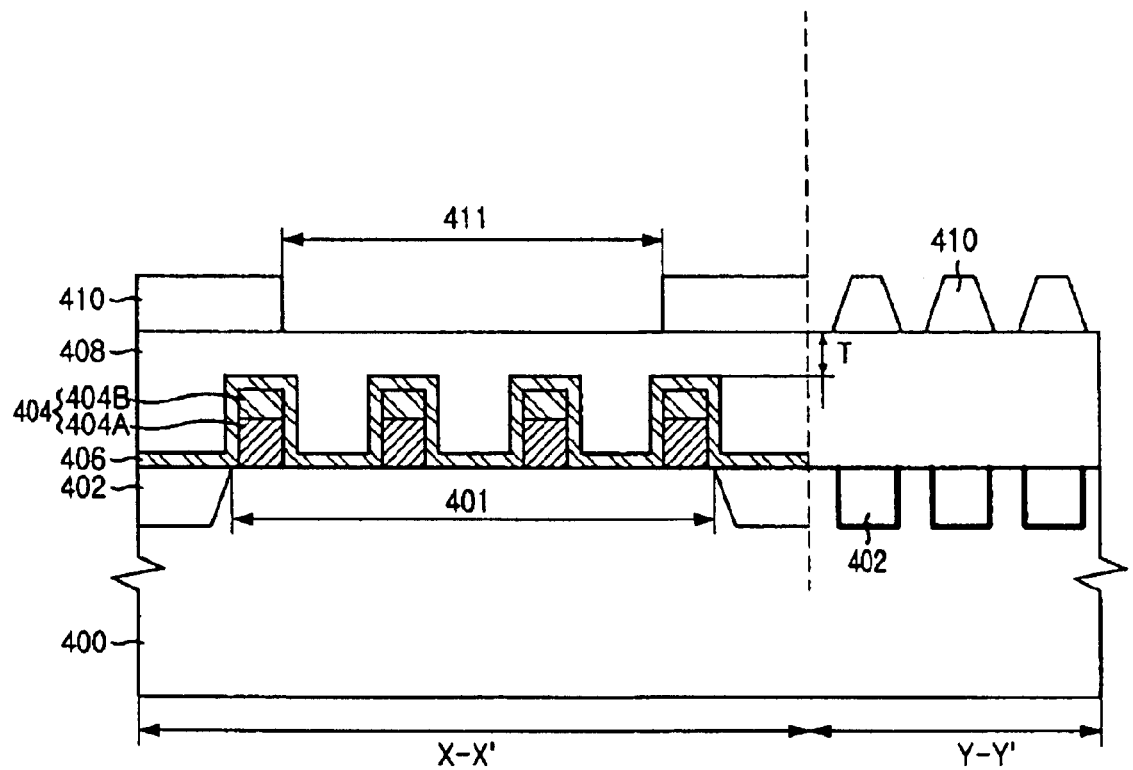

As shown in FIG. 5B, the inter-layer insulation layer 408 is formed on the above substrate structure including the etch stop layer. 406. The inter-layer insulation layer 408 is made of an oxide layer such as boron phosphorus silicate glass (BPSG), spin on glass (SOG), plasma enhanced oxide and advanced planarization layer (APL) oxide having an excellent gap-fill property for preventing occurrences of void. Also, the inter-layer insulation layer 408 has a thickness ranging from about 3000 Å to about 9000 Å. More preferably, the inter-layer insulation layer 408 is deposited to a thickness of about 5000 Å.

Afterwards, a chemical mechanical polishing (CMP) process or a blanket-etch process is performed to planarize the inter-layer insulation layer 408. The planarized inter-layer insulation layer 408 remains on the gate hard mask 404B with a thickness of about 1000 Å.

A photoresist pattern 410 is formed on the inter-layer insulation layer 408 in such a manner that a region 411 for forming a SAC (hereinafter referred to as a SAC region) in the cell array region is opened. The SAC region 411 can be a storage node contact region, a bit line contact region or a merged contact region obtained by merging the storage node contact region and the bit line contact region together. Herein, the illustrated SAC region is the merged contact region. The merged contact region is formed in a T-shape and includes a partial portion of the active region 401 and that of a non-active region.

In case of the T-shaped merged contact region, the size of the merged contact region is bigger than that of each storage node contact region and bit line contact region itself. As a result of this increased size, it is possible to prevent an etching stop phenomenon usually occurring when the contact region is small. In addition, compared to a structure taught in an article by Kohyama et al. entitled "A fully printable, self-aligned and planarized stacked capacitor DRAM cell technology for 1 Gbit DRAM and beyond", symp. On VLSI. Digest of Technical Papers, PP. 17–18, (1997), an occupying area of the photoresist pattern increases to thereby improve its etch selectivity.

Figure 5C:
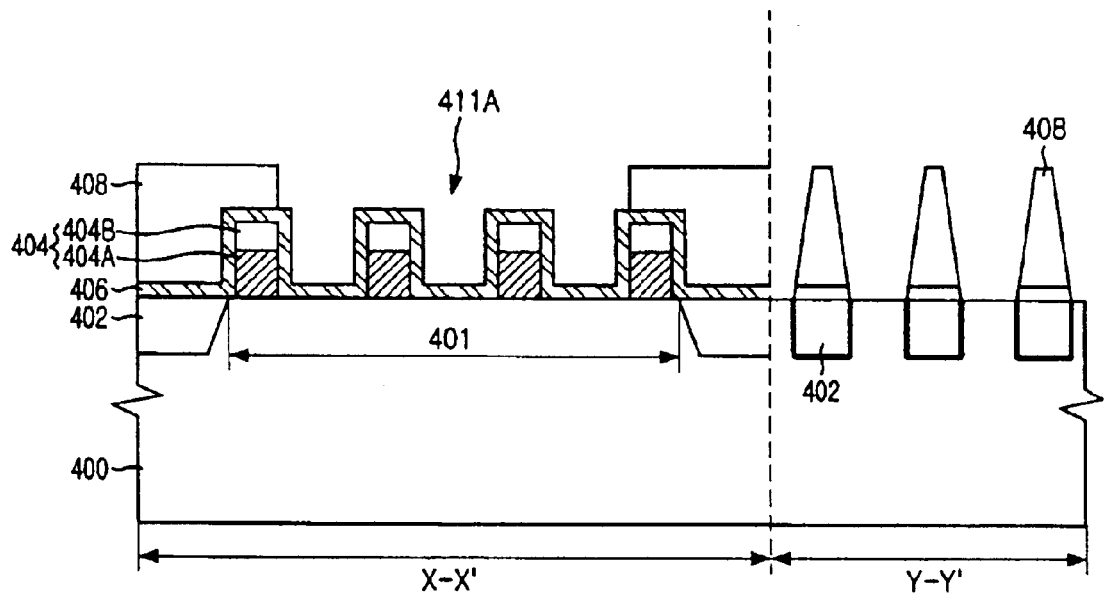

Next, referring to FIG. 5C, the inter-layer insulation layer 408 is etched until a partial portion of the etch stop layer 406 over the active region 401 is exposed. From this etching, a plurality of contact holes 411A are formed. During the etching to the inter-layer insulation layer 408, the etch stop layer 406 serves to play an etching stop function. In the mean time, a photoresist strip process is performed to remove the photoresist pattern 410. Then, etch remnants are removed through a wet cleaning process.

Figure 5D:
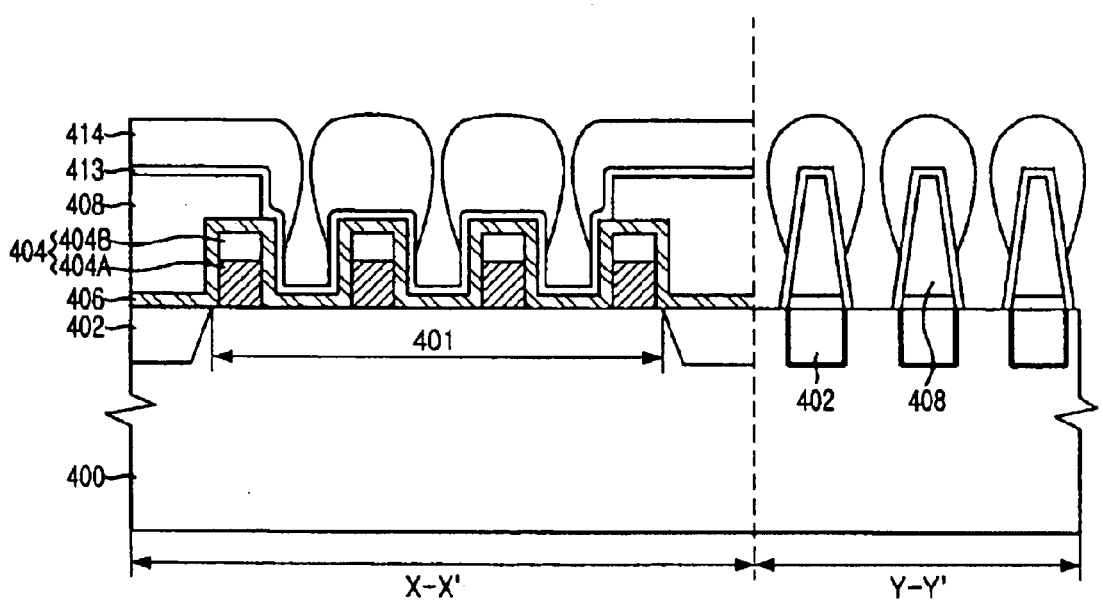

Referring to FIG. 5D, an attack barrier layer 413 is deposited along the above etch profile containing the contact holes 411A. The attack barrier layer 413 is for preventing the inter-layer insulation layer 408 from being attacked during a wet cleaning/etching process for extending the SAC contact region. For this purpose, the attack barrier layer 413 is made of a nitride-based material having a higher etch tolerance to a hydrofluoric acid (HF)-based solution than to an oxide layer. Examples of the nitride-based material for the attack barrier layer 413 are silicon nitride or silicon oxynitride.

In addition, the attack barrier layer 413 has a function that blocks chemicals used in the wet cleaning/etching process from being directly contacted to the inter-layer insulation layer 408. Therefore, it is preferable to deposit the attack barrier layer 413 with a thickness in a range from about 10 Å to about 100 Å to thereby minimize a decrease of the size of the SAC contact region.

Continuous to the attack barrier layer 413 deposition, a layer having a poor coverage property such as a plasma enhanced tetra-ethyl-ortho silicate (PETEOS) layer or an undoped silicate glass (USG) layer is deposited to form a capping layer 414. At this time, the capping layer 414 has an over-hang structure on an upper part of the gate electrode structure. Preferably, the sacrifice insulation layer 414 has a thickness ranging from about 500 Å to about 2000 Å.

Next, a wet cleaning/etching process is performed by using diluted HF-based chemicals in order to widen an opening portion of each contact hole 411A. It is preferable to employ such chemicals as a buffered oxide etchant (BOE) containing ammonium hydroxide ($NH_4OH$) and HF mixed in a ratio of about 50:1 to about 500:1 or a diluted HF solution diluted with $H_2O$ in a ratio of about 50:1 to about 500:1. At this time, the aforementioned function of the attack barrier layer 413 further prevents an undercut of the inter-layer insulation layer 408.

Figure 5E:
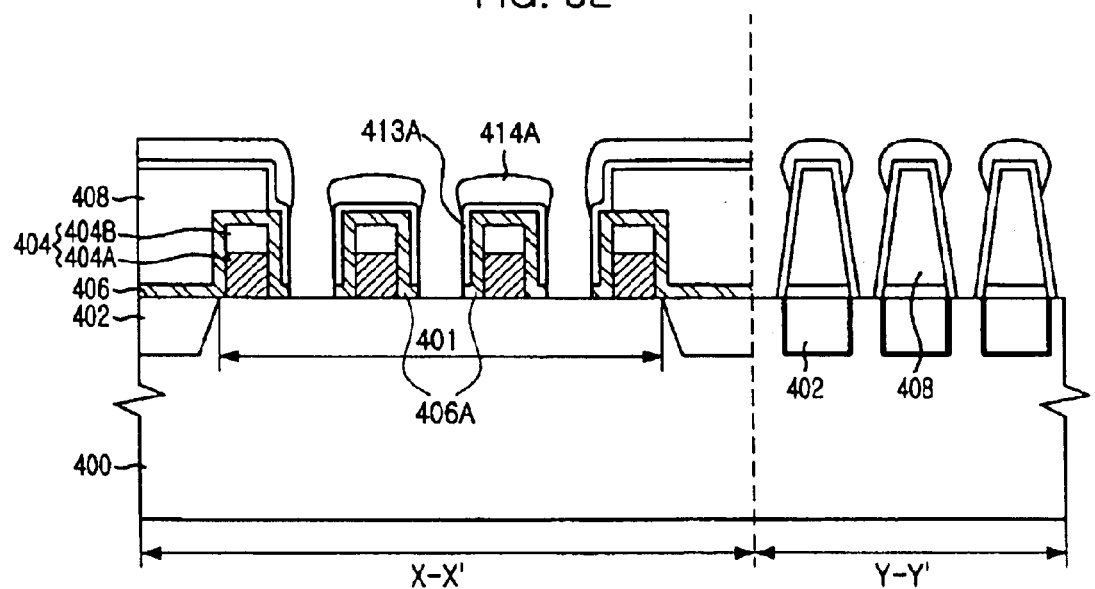

Continuously, referring to FIG. 5E, the etch stop layer 406 and the attack barrier layer 413 deposited on the opening portion of the contact hole 411A are removed. Afterwards, the rest of the etch stop layer 406 and the attack barrier layer 413 remain as spacers 406A and 413A at both lateral sides of the gate conductive layer 404A and the gate hard mask 404B. Hereinafter, the spacers 406A and 413A are referred to as gate spacers.

Additionally, it is possible to perform an ion-implantation to the active regions 401 at both sides of the gate spacers 406A and 413A to reduce a contact resistance between a subsequently formed SAC plug and the corresponding active region 401.

Figure 5F:
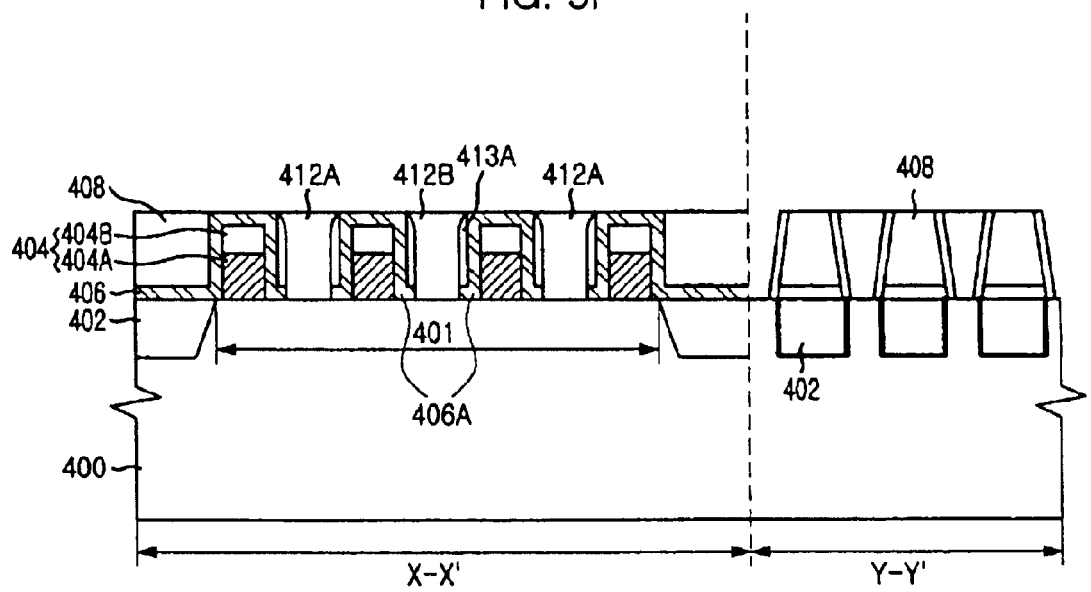

Referring to FIG. 5F, a conductive layer made of polysilicon or tungsten is deposited on the above entire structure until being completely filled into the contact hole 411A. At this time, the conductive layer is deposited preferably to a thickness ranging from about 3000 Å to about 7000 Å. The conductive layer is then subjected to a chemical mechanical polishing (CMP) process or a blanket-etch process until an upper surface of the inter-layer insulation layer 408 is exposed. In case of performing the CMP process to the conductive layer, slurry used for a typical polysilicon layer or tungsten layer is used.

The inter-layer insulation layer 408 and the conductive layer are planarized through a CMP process until an upper surface of the etch stop layer 406 over the upper surface of the gate hard mask 404B is exposed. From this CMP process, storage node contact plugs 412A and bit line contact plugs 412B are electrically isolated from each other. Herein, the CMP process to the inter-layer insulation layer 408 and the conductive layer also employs slurry used for etching a typical oxide layer.

In case that the SAC contact region is not the merged contact region, the CMP process for isolating electrically the storage node contact plugs 412A and the bit line contact plugs 412B from each other is omitted.

Figure 1A:
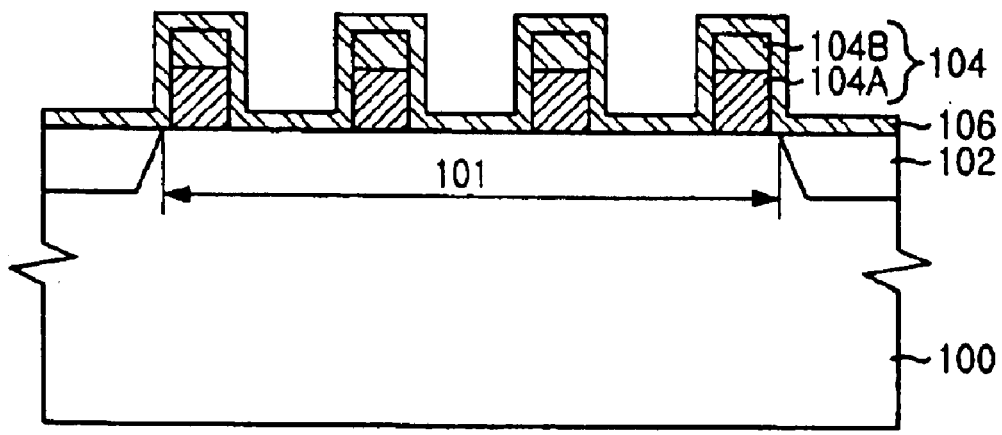
FIGS. 1A to 1E are cross-sectional views showing a conventional method for forming a self-aligned contact (SAC) plug in a semiconductor device.
Figure 1B:
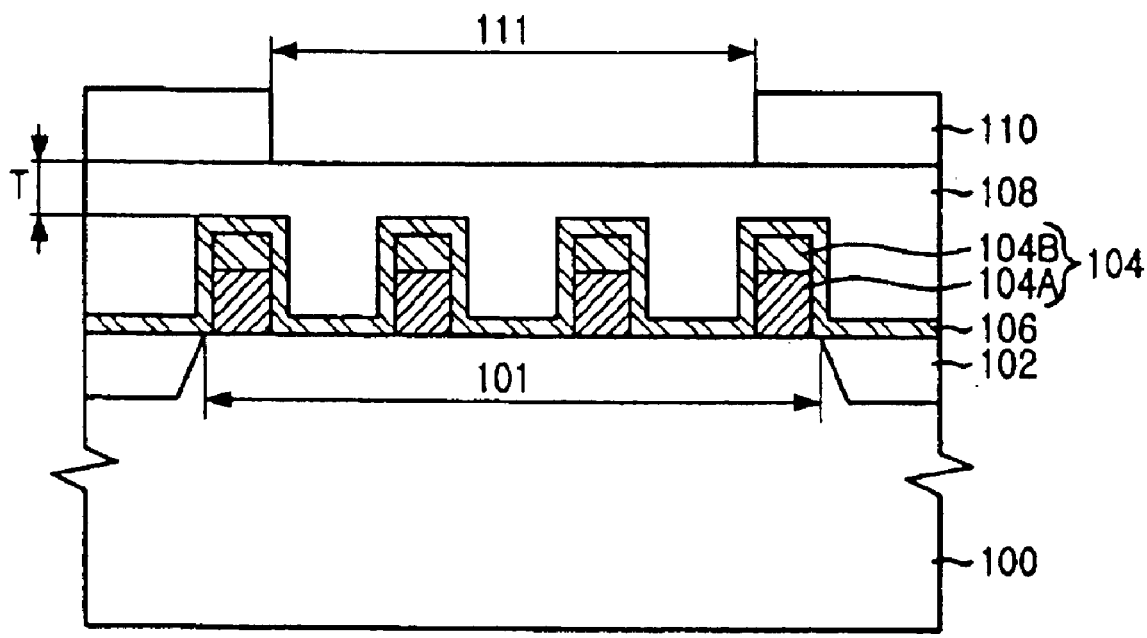
Figure 1C:
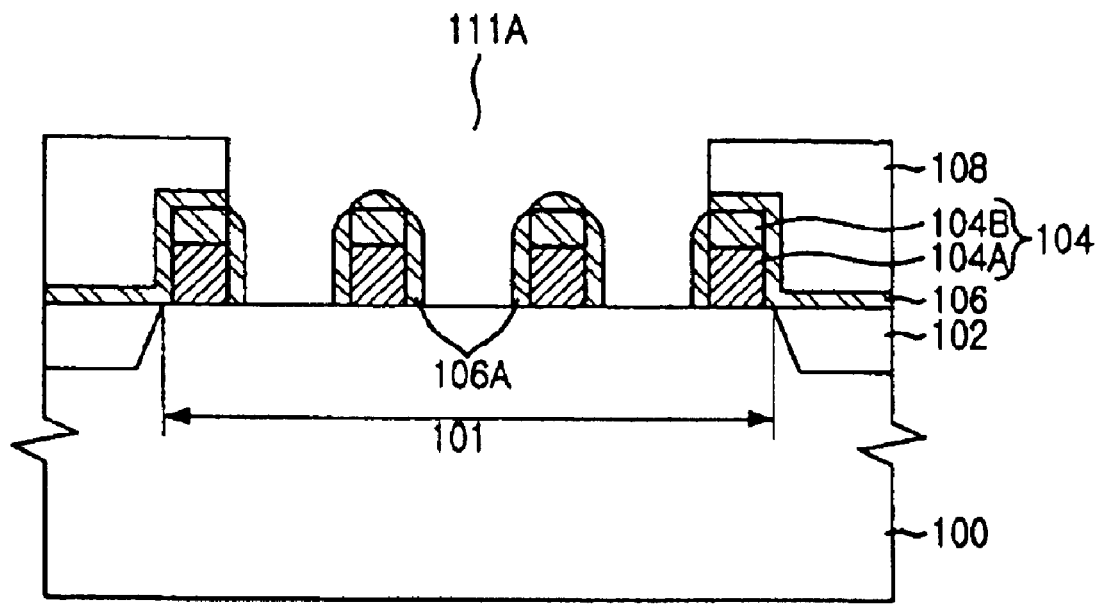
Figure 1D:
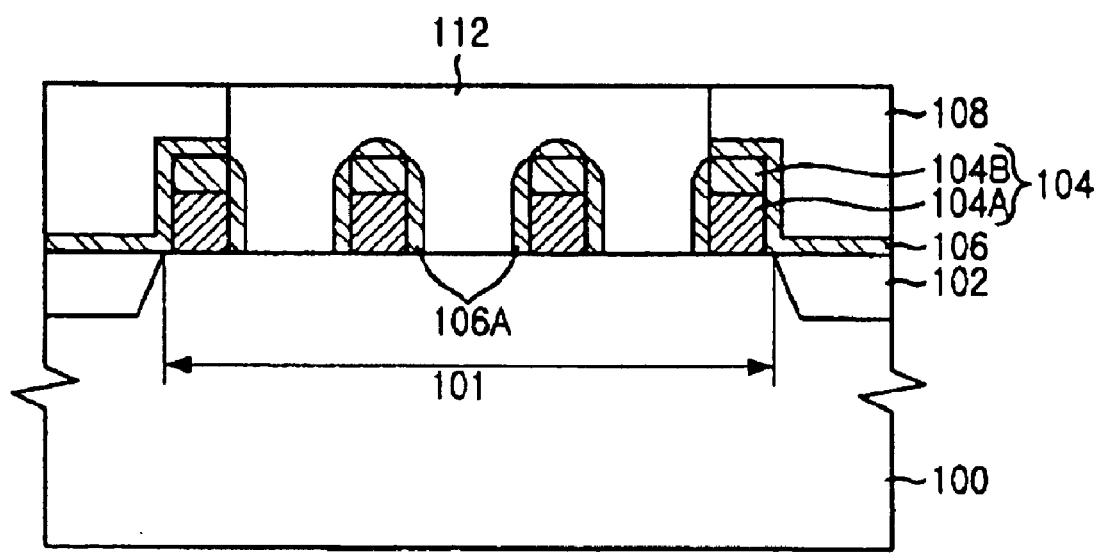
Figure 1E:
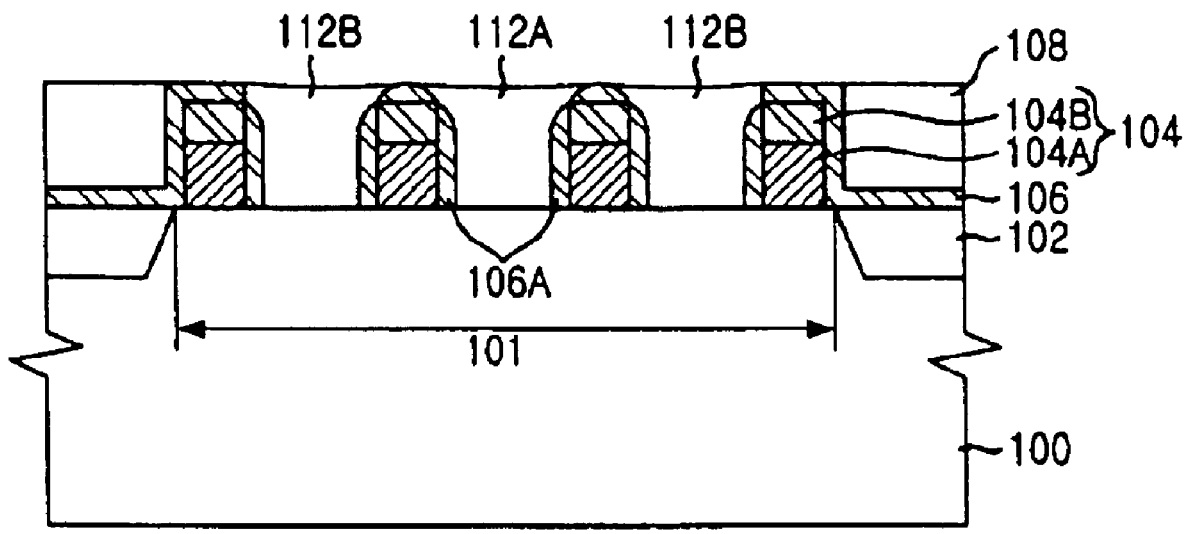
Figure 2:
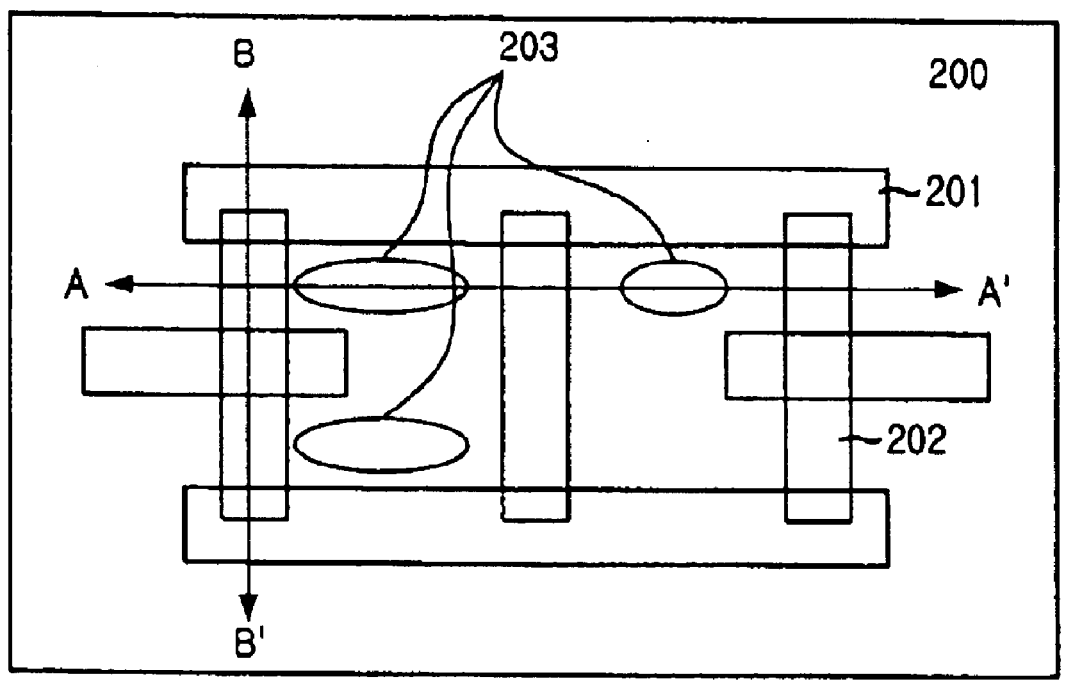
FIG. 2 is a top view of the conventional semiconductor device completed with the SAC process for forming the SAC plug.
Figure 3A:
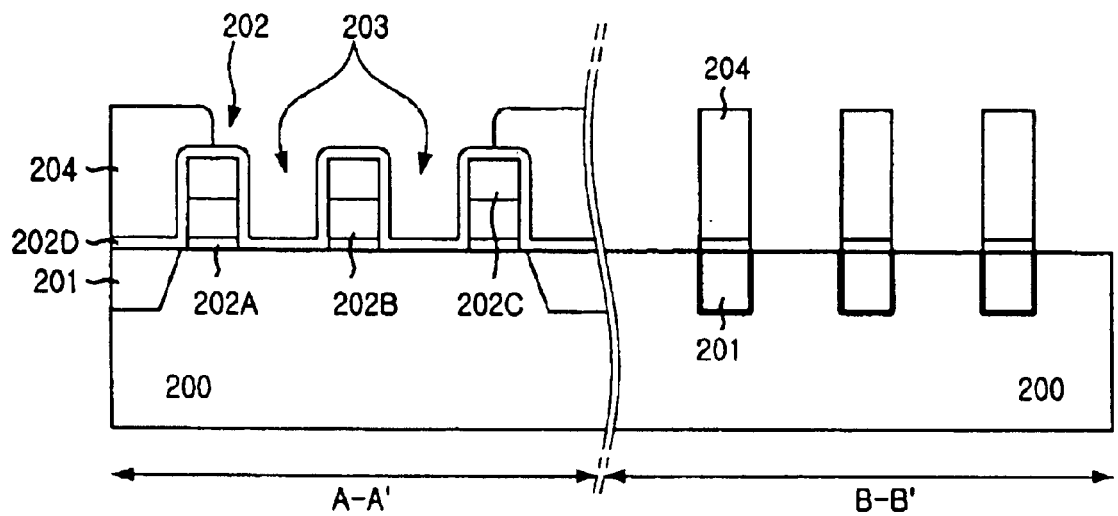
FIGS. 3A and 3B are cross-sectional views of FIG. 2 in each direction of the lines A–A' and B–B'.
Figure 3B:
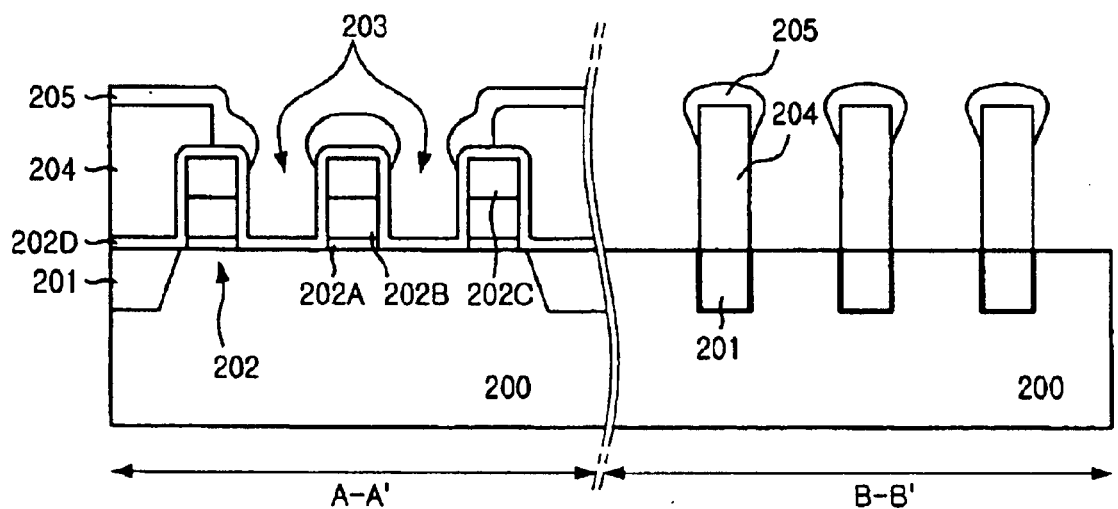
Figure 6A:
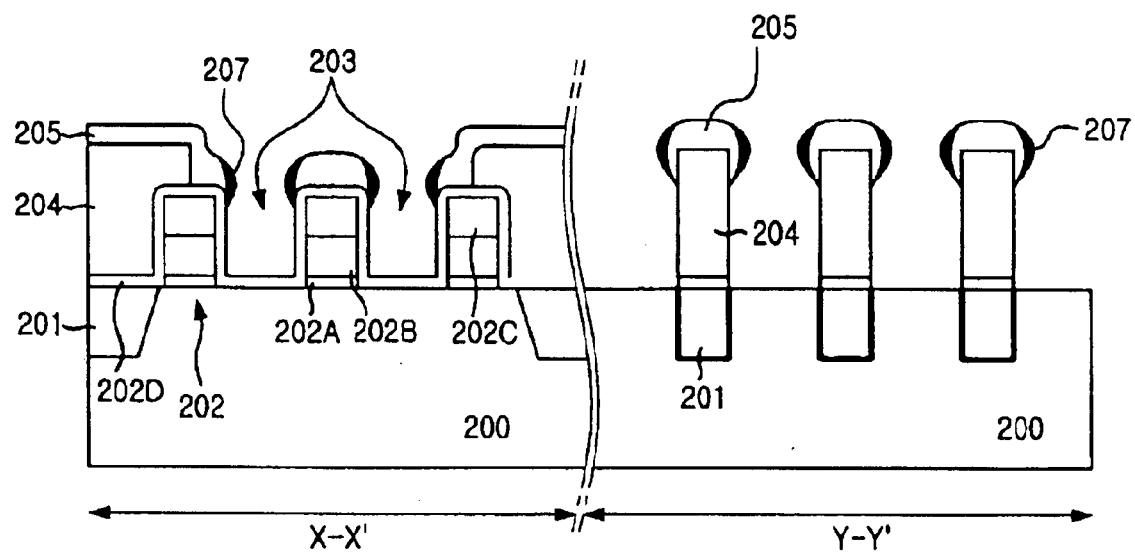
FIGS. 6A to 6C are cross-sectional views showing a method for fabricating a semiconductor device in accordance with a second preferred embodiment of the present invention.
Figure 6B:
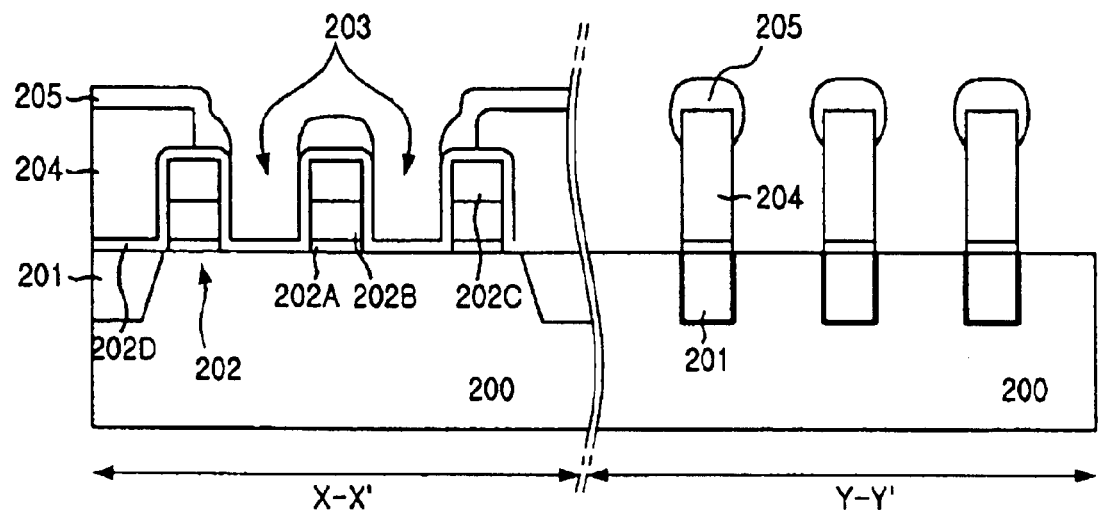
Figure 6C:
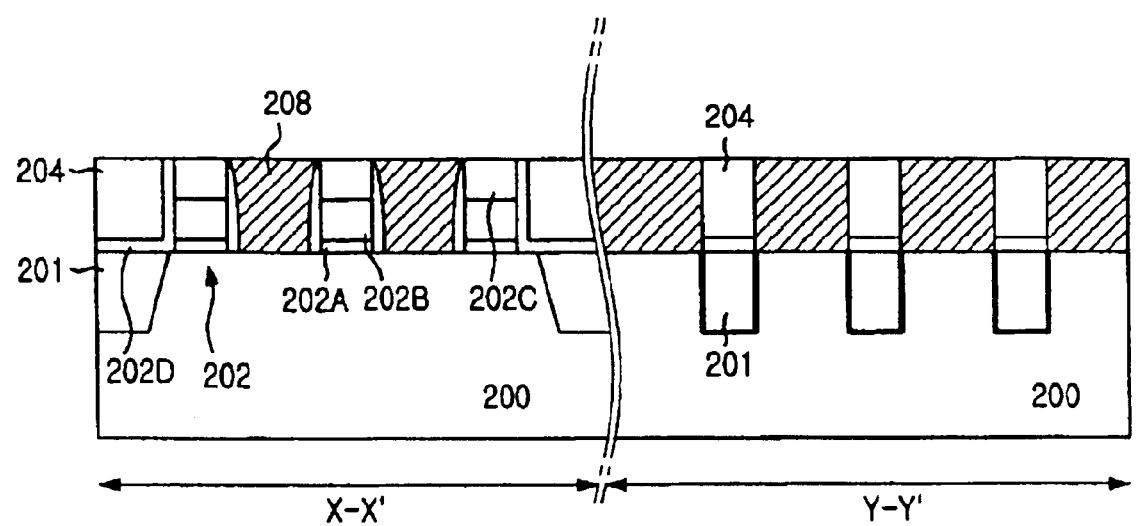

FIGS. 6A to 6C are cross-sectional views showing a method for fabricating a semiconductor device in accordance with a second preferred embodiment of the present invention. The processes described in FIG. 2 and FIGS. 3A and 3B are performed identically, and thus, detailed descriptions on these processes are omitted for convenience. Also, the same reference numerals, are used for the same constitution elements.

Referring to FIG. 6A, a capping layer 205 is formed on an upper part of the gate electrode pattern 202, and bonding forces between atoms contained in sidewalls of a capping layer 205 are weakened by using an inert gas. Hereinafter, this weakened boding forces between atoms is referred to as impairment. This impairment is denoted as the reference numeral 207. Such gas as He, Ne, Ar, Kr and Xe are examples of the inert gas. At this time, an ion-implantation or an etch technique employing plasma (hereinafter referred to as a plasma etching technique) is performed to the sidewalls of the capping layer 205 with use of the inert gas. As a result, these impaired sidewalls 207 of the capping layer 205 can be easily removed during a subsequent wet cleaning/etching process.

Next, referring to FIG. 6B, the wet cleaning/etching process is performed to widen an opening portion of each contact hole 203. At this time, the wet cleaning/etching process uses diluted HF-based chemicals. From this wet cleaning/etching, the impaired sidewalls 207 of the capping layer 205 are removed. Herein, the diluted HF-based chemical is preferably a BOE containing $NH_4OH$ and HF mixed in a ratio of about 50:1 to about 500:1 or a diluted HF solution diluted with $H_2O$ in a ratio of about 50:1 to about 500:1. These processes contribute to make an improvement on a negative slope of the capping layer 205 to thereby prevent occurrences of the void phenomenon when a plug conductive layer is deposited.

Referring to FIG. 6C, an etch stop layer 202D particularly formed at a bottom side of the contact hole 203 is removed through a blanket-etch process. The rest of the etch stop layer 202D remain as a spacer at both sides of the gate electrode 202.

The plug conductive layer is deposited on the above entire structure until being completely filled into the contact holes 203. A polysilicon layer or a tungsten layer is an example of the plug conductive layer. Herein, the deposited thickness of the plug conductive layer preferably ranges from about 3000 Å to about 7000 Å.

The CMP process or a blanket-etch process is performed until an upper surface of the capping layer 205 is exposed. In case of employing the CMP process for the planarization of the plug conductive layer, slurry used for etching a typical polysilicon layer or tungsten layer is employed in the CMP process.

Then, a CMP process is performed again to the capping layer 205 and the plug conductive layer until an upper surface of the gate hard mask 202C is exposed. This CMP process defines plugs 208 for storage node contacts and plugs 208 for bit line contact plugs and isolates them electrically from each other. Herein, the CMP process uses slurry used for etching a typical oxide layer.

In accordance with the preferred embodiments of the present invention, it is possible to prevent generations of seam during a plug formation. This effect is achieved by forming the attack barrier layer along an etch profile of the contact hole for forming a storage node contact plug or a bit line contact plug. The function of the attack barrier layer is to prevent the inter-layer insulation layer from being chemically attacked during the wet cleaning/etching process performed for extending the contact region.

To solve a gap-fill problem arose during the plug formation, sidewalls of the capping layer is impaired with use of the inert gas and the impaired sidewalls of the capping layer are removed in the wet cleaning/etching process for extending an opening portion of each contact hole. This removal of the sidewalls of the capping layer improves an etch profile including the conductive pattern, i.e., the gate electrode pattern, to thereby improve the gap-fill property during a deposition of the plug material. As a result of these improvements, occurrences of the void phenomenon can be suppressed to thereby further prevent generations of seam in the plug. Furthermore, these effects contribute to make increased yields of semiconductor devices with fewer defects.

In addition, although the present invention exemplifies cases of forming the plug in between the gate electrodes, it is applicable for any type of conductive patterns such as a bit line or a metal wire pattern.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:

forming a plurality of conductive patterns on a substrate;

forming an etch stop layer along the plurality of the conductive patterns;

forming an insulation layer on an entire surface of the substrate structure;

etching selectively the insulation layer to form a plurality of contact holes exposing a portion of the etch stop layer allocated in between the conductive patterns;

forming an attack barrier layer for preventing the insulation layer from being attacked by a chemical used in a wet cleaning/etching process along a profile containing the contact hole;

forming a capping layer having an over-hang structure on an upper part of each conductive pattern;

extending an opening portion of each contact hole by performing a wet cleaning/etching process to a bottom side of each contact hole;

removing selectively a portion of the etch stop layer and the attack barrier layer disposed at the bottom side of each contact hole to expose a surface of the substrate; and forming a plug contacted to the exposed surface of the contact hole.

2. The method as recited in claim 1, wherein the attack barrier layer is a nitride-based layer.

3. The method as recited in claim 2, wherein the attack barrier layer has a thickness ranging from about 10 Å to about 100 Å.

4. The method as recited in claim 2, wherein the wet cleaning/etching process uses a buffered oxide etchant containing ammonium hydroxide ($NH_4OH$) and hydrofluoric acid (HF) mixed in a ratio of about 50:1 to about 500:1 or a diluted HF solution diluted with $H_2O$ in a ratio of about 50:1 to about 500:1.

5. The method as recited in claim 1, wherein the capping layer is made of plasma enhanced tetra-ethyl-ortho silicate (PETEOS) or undoped silicate glass (USG).

6. The method as recited in claim 1, further comprising the step of weakening bonding forces between atoms contained in sidewalls of the capping layer with use of an inert gas after forming the capping layer and wherein the sidewalls of the capping layer containing the atoms with weakened bonding forces are removed at the step of performing the wet cleaning/etching process.

7. The method as recited in claim 6, wherein the step of weakening bonding forces between atoms contained in sidewalls of the capping layer is performed by using a plasma etching technique employing the inert gas.

8. The method as recited in claim 6, wherein, at the step of weakening bonding forces between atoms contained in sidewalls of the capping layer, the inert gas is ion-implanted onto the sidewalls of the capping layer.

9. The method as recited in claim 5, wherein the capping layer has a thickness ranging from about 500 Å to about 2000 Å.

10. The method as recited in claim 1, wherein the conductive pattern includes a gate electrode pattern, a bit line pattern or a metal wire pattern.

11. The method as recited in claim 1, wherein the plug is formed with a polysilicon layer or a tungsten layer.

12. A method for fabricating a semiconductor device, comprising the steps of:

forming a plurality of conductive patterns on a substrate;

forming an etch stop layer along the plurality of the conductive patterns;

forming an insulation layer on an entire surface of the substrate structure;

etching selectively the insulation layer to form a plurality of contact holes exposing a portion of the etch stop layer allocated in between the conductive patterns;

forming a capping layer having an over-hang structure on an upper part of each conductive pattern;

weakening bonding forces between atoms contained in sidewalls of the capping layer with use of an inert gas;

extending an opening portion of the contact hole by performing a wet cleaning/etching process and simultaneously removing the sidewalls of the capping layer;

removing selectively a portion of the etch stop layer disposed at a bottom side of each contact hole to expose a surface of the substrate; and forming a plug contacted to the exposed surface of the substrate.

13. The method as recited in claim 12, wherein the step of weakening bonding forces between atoms contained in sidewalls of the capping layer is performed by using a plasma etching technique employing the inert gas.

14. The method as recited in claim 12, wherein, at the step of weakening bonding forces between atoms contained in sidewalls of the capping layer, the inert gas is ion-implanted onto the sidewalls of the capping layer.

15. The method as recited in claim 12, wherein, at the step of performing a wet cleaning/etching process, the wet cleaning/etching process uses a buffered oxide etchant containing $NH_4OH$ and HF mixed in a ratio of about 50:1 to about 500:1 or a diluted HF solution diluted with $H_2O$ in a ratio of about 50:1 to about 500:1.

16. The method as recited in claim 12, wherein the capping layer is made of PETEOS or USG.

17. The method as recited in claim 12, wherein the conductive pattern includes a gate electrode pattern, a bit line pattern or a metal wire pattern.

18. The method as recited in claim 12, wherein the plug is made of a polysilicon layer or a tungsten layer.

* * * * *